US012620957B2

(12) United States Patent
Feng et al.

(10) Patent No.: US 12,620,957 B2
(45) Date of Patent: May 5, 2026

(54) FILTER, INTEGRATED PASSIVE DEVICE AND ELECTRONIC DEVICE

(71) Applicants: Beijing BOE Sensor Technology Co., Ltd., Beijing (CN); BOE Technology Group Co., Ltd., Beijing (CN)

(72) Inventors: Chunnan Feng, Beijing (CN); Yulin Feng, Beijing (CN); Xue Cao, Beijing (CN); Yue Li, Beijing (CN); Yuelei Xiao, Beijing (CN); Huiying Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 140 days.

(21) Appl. No.: 18/762,671

(22) Filed: Jul. 3, 2024

(65) Prior Publication Data

US 2024/0356512 A1     Oct. 24, 2024

Related U.S. Application Data

(63) Continuation of application No. PCT/CN2023/082769, filed on Mar. 21, 2023.

(51) Int. Cl.
H03H 7/01          (2006.01)

(52) U.S. Cl.
CPC ........ H03H 7/0115 (2013.01); H03H 7/1758 (2013.01); H03H 7/1766 (2013.01); H03H 7/1775 (2013.01)

(58) Field of Classification Search
CPC ................... H03H 7/0115; H03H 7/09; H03H 2001/0085; H03H 7/1758; H03H 7/0161;
(Continued)

(56) References Cited

U.S. PATENT DOCUMENTS

| | | | |
|---|---|---|---|
| 2016/0134308 A1* | 5/2016 | Schmidhammer ..... | H04B 1/005 370/277 |
| 2018/0152210 A1 | 5/2018 | Araki | |
| 2018/0212452 A1* | 7/2018 | Chou ...................... | H02J 50/12 |

FOREIGN PATENT DOCUMENTS

| | | |
|---|---|---|
| CN | 112583373 A | 3/2021 |
| CN | 113346852 A | 9/2021 |

(Continued)

*Primary Examiner* — Lincoln D Donovan
*Assistant Examiner* — Tyler J Pereny
(74) *Attorney, Agent, or Firm* — IPro, PLLC

(57) ABSTRACT

A filter, an integrated passive device and an electronic device are disclosed. The filter includes a first port, a second port, a first band-pass filter circuit, a second band-pass filter circuit, and a third band-pass filter circuit; the first band-pass filter circuit is configured to input a first signal with a frequency between a first frequency and a second frequency in an initial signal input from the first port to the second band-pass filter circuit; the second band-pass filter circuit is configured to receive the first signal, and input a second signal with a frequency between a third frequency and a fourth frequency in the first signal to third band-pass filter circuit; the third band-pass filter circuit is configured to receive the second signal, and input a third signal with a frequency between a fifth frequency and a sixth frequency in the second signal to the second port.

18 Claims, 9 Drawing Sheets

(58) Field of Classification Search
CPC .. H03H 7/1766; H03H 7/1775; H03H 7/1708;
H03H 7/01; H03H 7/075; H03H 7/38;
H03H 7/12; H03H 7/1783; H03H 7/463;
H03H 7/1725; H03H 7/1791; H03H
11/04; H03H 2001/0021; H03H 7/175;
H03H 2007/013; H01F 17/0013; H01F
2017/0026; H01F 2027/2809; H01F
27/2804; H01F 2017/004; H01F
2200/165; H01F 3/195; H01F 3/245;
H01F 1/565; H01F 2200/451; H01F 3/19;
H04B 1/0057; H04B 1/44; H04B 1/52
See application file for complete search history.

(56)                                 References Cited

FOREIGN PATENT DOCUMENTS

| | | |
|---|---|---|
| CN | 114679149 A | 6/2022 |
| CN | 115459725 A | 12/2022 |
| WO | 2023273391 A1 | 1/2023 |

\* cited by examiner

D1
J
D2

RDL wire

Via hole

FILTER, INTEGRATED PASSIVE DEVICE AND ELECTRONIC DEVICE

CROSS REFERENCE TO RELATED APPLICATION

This application is a continuation application of International Application No. PCT/CN2023/082769, filed on Mar. 21, 2023, which is hereby incorporated by reference in its entirety.

TECHNICAL FIELD

The present disclosure relates to the field of electronic technology, and in particular to a filter, an integrated passive device and an electronic device.

BACKGROUND

Filters are widely used as an essential and important component in the communication system.

There are many different types of traditional filters, including LC filters, cavity filters, etc. Cavity filters are large in size and are generally used in base stations, etc. LC filters have a low degree of integration, are large in size for common devices, and are mainly used in low-frequency regions, with poor filtering characteristics for high-frequency signals.

SUMMARY

The present disclosure provides a filter, the filter includes: a first port, a second port, a first band-pass filter circuit, a second band-pass filter circuit, and a third band-pass filter circuit; the first band-pass filter circuit is connected with the first port and configured to input a first signal with a frequency between a first frequency and a second frequency in an initial signal input from the first port to the second band-pass filter circuit;

the second band-pass filter circuit is connected with the first band-pass filter circuit and configured to: receive the first signal, and input a second signal with a frequency between a third frequency and a fourth frequency in the first signal to the third band-pass filter circuit; and the third band-pass filter circuit is connected with the second band-pass filter circuit and configured to: receive the second signal, and input a third signal with a frequency between a fifth frequency and a sixth frequency in the second signal to the second port;

where the first frequency and the fifth frequency are each greater than the third frequency, the sixth frequency and the fourth frequency are each greater than the second frequency, and the second frequency is greater than the first frequency.

In some possible embodiments, the first frequency is same as the fifth frequency, and the sixth frequency is same as the fourth frequency.

In some possible embodiments, the first band-pass filter circuit includes: a first capacitor, a second capacitor, a third capacitor, a fourth capacitor, a first inductor, a second inductor, and a ground terminal;

a first electrode of the first capacitor is connected with the first port, and a second electrode of the first capacitor is connected with a first electrode of the second capacitor;

a second electrode of the second capacitor is connected with the second band-pass filter circuit;

a first electrode of the third capacitor is connected with the second electrode of the second capacitor, and a second electrode of the third capacitor is connected with a first electrode of the fourth capacitor;

a second electrode of the fourth capacitor is connected with the ground terminal;

a first electrode of the first inductor is connected with the first electrode of the first capacitor, and a second electrode of the first inductor is connected with the second electrode of the first capacitor; and a first electrode of the second inductor is connected with the first electrode of the fourth capacitor and a second electrode of the second inductor is connected with the second electrode of the fourth capacitor.

In some possible embodiments, the first inductor and the second inductor are multilayer inductors.

In some possible embodiments, the second band-pass filter circuit includes: a fifth capacitor, a sixth capacitor, a third inductor, and a ground terminal;

a first electrode of the fifth capacitor is connected with the first band-pass filter circuit, and a second electrode of the fifth capacitor is connected with the third band-pass filter circuit;

a first electrode of the sixth capacitor is connected with the second electrode of the fifth capacitor, and a second electrode of the sixth capacitor is connected with a first electrode of the third inductor; and a second electrode of the third inductor is connected with the ground terminal.

In some possible embodiments, the third inductor is a multilayer inductor.

In some possible embodiments, the third band-pass filter circuit includes: a seventh capacitor, an eighth capacitor, a ninth capacitor, a fourth inductor, a fifth inductor, and a ground terminal;

a first electrode of the seventh capacitor is connected with the second band-pass filter circuit, and a second electrode of the seventh capacitor is connected with a first electrode of the eighth capacitor;

a second electrode of the eighth capacitor is connected with the second port;

a first electrode of the ninth capacitor is connected with the first electrode of the seventh capacitor, and a second electrode of the ninth capacitor is connected with a first electrode of the fourth inductor;

a second electrode of the fourth inductor is connected with the ground terminal; and a first electrode of the fifth inductor connected with the first electrode of the seventh capacitor, and a second electrode of the fifth inductor is connected with the second electrode of the seventh capacitor.

In some possible embodiments, the fourth inductor and the fifth inductor are single-turn inductors.

In some possible embodiments, the first electrode or the second electrode of the seventh capacitor is multiplexed as a connection wire of the fifth inductor; and the first electrode or the second electrode of the ninth capacitor is multiplexed as a connection wire of the fourth inductor.

In some possible embodiments, a connecting line between a capacitor and an inductor in the filter is a stubby type connecting line.

In some possible embodiments, capacitors in the filter have different capacitance values.

In some possible embodiments, the capacitance values of the capacitors in the filter range from 0.5 pF to 10 pF.

In some possible embodiments, inductors in the filter have different inductance values.

In some possible embodiments, the inductance values of the inductors in the filter range from 0.5 nH to 10 nH.

In some possible embodiments, the filter is formed on a glass substrate.

In some possible embodiments, the filter is a high frequency filter.

Embodiments of the present disclosure provide an integrated passive device including the above filter.

Embodiments of the present disclosure provide an electronic device including the above integrated passive device.

DETAILED DESCRIPTION

Figure 1:
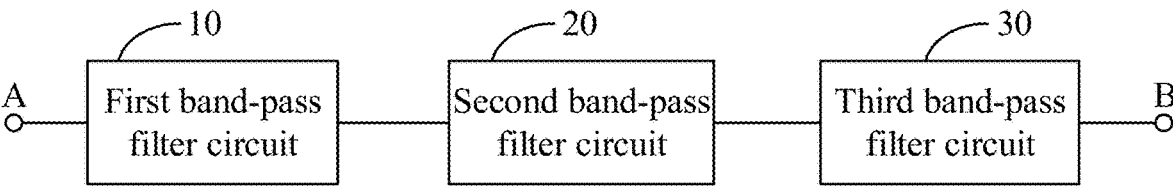
FIG. 1 shows a schematic diagram of some structures of a filter according to embodiments of the present disclosure.

In order to make the objectives, technical solutions and advantages of embodiments of the present disclosure clearer, the technical solutions of embodiments of the present disclosure are described clearly and completely below with reference to the drawings of embodiments of the present disclosure. Apparently, the described embodiments are some, not all, of embodiments of the present disclosure. Embodiments in the present disclosure and the features in embodiments may be combined with each other without conflict. Based on the described embodiments of the present disclosure, all other embodiments obtained by those of ordinary skill in the art without inventive efforts fall within the protection scope of the present disclosure.

Unless otherwise indicated, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "including" or "containing" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect.

It should be noted that the sizes and shapes of the figures in the drawings do not reflect true proportions and are only intended to illustrate the present disclosure. And the same or similar reference numbers throughout represent the same or similar elements or elements with the same or similar functions.

With the development of the country in aerospace, defense technology, satellite remote sensing and radar communications and other technologies, communication technology has developed rapidly, and the performance, volume, reliability and other requirements of microwave radio frequency (RF) devices have become increasingly stringent. In addition, due to the rapid popularization of 5G technology, the use of high-speed signals in daily life and industry has also been greatly increased. Therefore, the development of high-speed signal electronic devices has become the core of the development of communication technology.

Communication systems include many common radio frequency structures, such as filters, baluns, duplexers, switches, etc. These structures are generally used to form a complete system through a printed circuit board (PCB) with external circuits and discrete capacitors and inductors. These devices and circuit structures occupy most of the area of the PCB structure, more than 50% or more, which seriously affects the development of communication system miniaturization.

Filters are widely used as an essential and important component of the communication system. There are many different types of traditional filters, including LC filters, cavity filters, etc. Cavity filters are large in size and are generally used in base stations and other fields. LC filters may realize the filtering function by arranging different numbers of inductors, capacitors and resistors according to the circuit design, and can be used in some small electronic devices.

However, LC filters composed of traditional discrete devices have a low degree of integration, are large in size for common devices, and are mainly used in the low-frequency region, with poor filtering characteristics for high-frequency signals. Technical indicators of the filter in use include passband band, bandwidth, insertion loss, out-of-band suppression, and so on. In the 5G era, large bandwidth, low loss, and fast out-of-band attenuation are the core objectives of the development of communication technology.

Transmission line filter in the microwave range has a simple structure, but the structure is related to the frequency and the size is often relatively large. In the field of radio frequency, the frequency is generally in GHz. In order to meet the conditions of use, the length of the device is generally a resonant unit of half wavelength or quarter wavelength, the size of the device has increased greatly, which cannot meet the development of miniaturization. The traditional LC filter is composed of discrete devices, which has low degree of integration, low Q value and poor insertion loss, and cannot be compatible with the characteristics of large bandwidth, high roll-off and high out-of-band suppression under RF. At the same time, the traditional LC circuit is mainly used in lower frequency bands, and it is less used in the high-frequency field, and it is difficult to realize the circuit with low in-band insertion loss and high out-of-band suppression.

Based on this, the present disclosure provides a filter that effectively realizes characteristics of low insertion loss in the passband, fast attenuation at the band edges, multiple transmission zeros, and better out-of-band suppression by combining a inductor having a high Q value and an ultra-thin and small-size capacitor through a band-pass filter circuit. In addition, the circuit design of the present disclosure can be applied in the field of integrated passive technology, effectively realizing the goal of miniaturization of the filter as well as low cost.

A filter according to embodiments of the present disclosure, as shown in FIG. 1, includes: a first port A, a second port B, a first band-pass filter circuit 10, a second band-pass filter circuit 20, and a third band-pass filter circuit 30. The first band-pass filter circuit 10 is connected with the first port A and configured to input a first signal with a frequency between a first frequency and a second frequency in an initial signal input from the first port A to the second band-pass filter circuit 20; the second band-pass filter circuit 20 is connected with the first band-pass filter circuit 10, and is configured to receive the first signal and input a second signal with a frequency between a third frequency and a fourth frequency in the first signal to the third band-pass filter circuit 30; and the third band-pass filter circuit 30 is connected with the second band-pass filter circuit 20, and is configured to receive the second signal and input a third signal with a frequency between a fifth frequency and a sixth frequency in the second signal to the second port B. The first frequency and the fifth frequency are each greater than the third frequency, the sixth frequency and the fourth frequency are each greater than the second frequency, and the second frequency is greater than the first frequency.

In embodiments of the present disclosure, by the interplay of the first port, the second port, the first band-pass filter circuit, the second band-pass filter circuit, and the third band-pass filter circuit, the transmission zeros are increased, the out-of-band suppression is improved, and thus a filter having multiple transmission zeros, a large bandwidth, a high roll-off characteristic, and a high out-of-band suppression is constituted.

In embodiments of the present disclosure, the first frequency is the same as the fifth frequency, and the sixth frequency is the same as the fourth frequency.

For instance, the first frequency is 3.3 GHZ, the second frequency is 4.2 GHZ, the third frequency is 2 GHZ, the fourth frequency is 6 GHZ, the fifth frequency is 3.3 GHZ, and the sixth frequency is 6 GHz. Of course, in specific implementation, the first frequency to the sixth frequency may be determined according to requirements of actual applications, and will not be limited herein.

Figure 2:
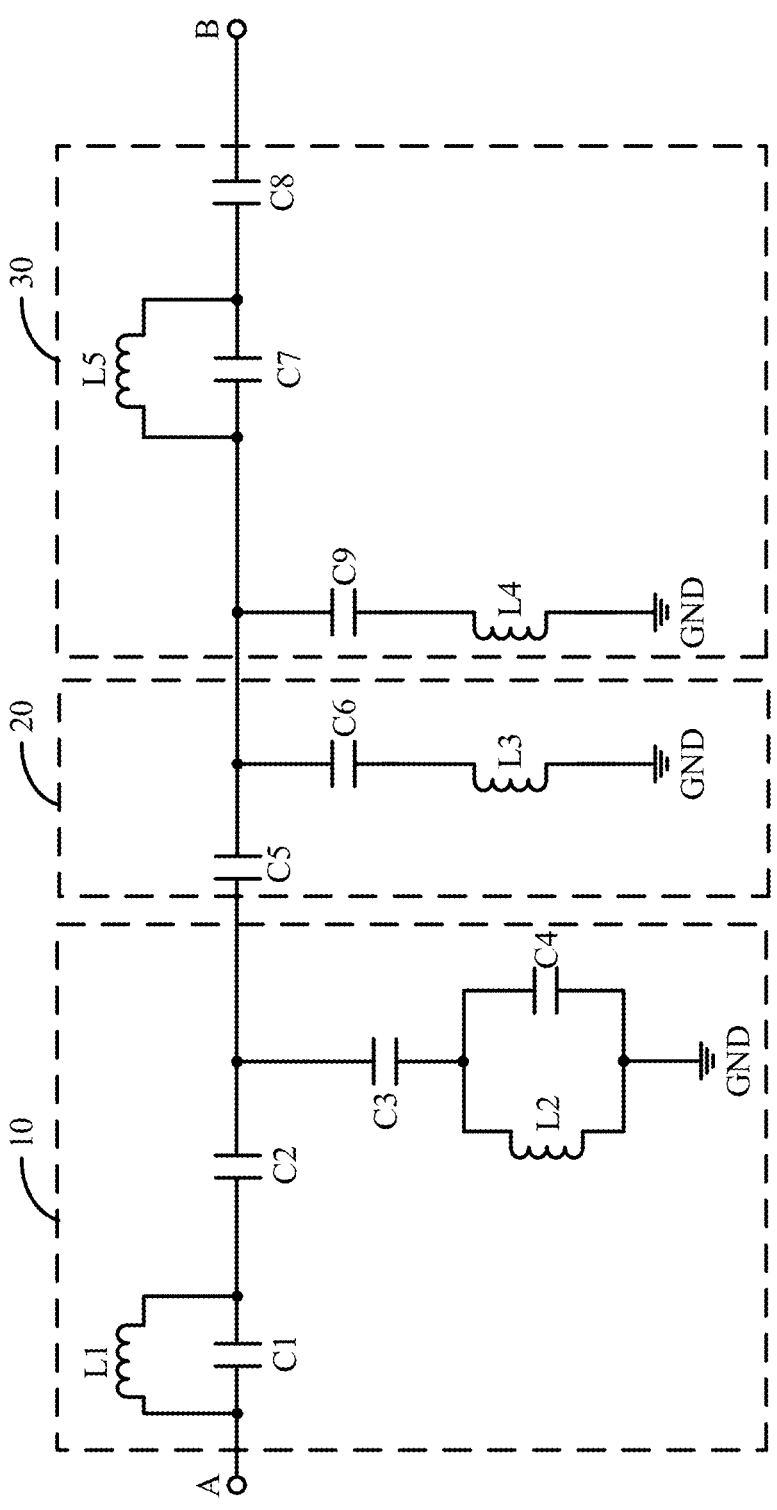
FIG. 2 shows another schematic diagram of some structures of a filter according to embodiments of the present disclosure.

In embodiments of the present disclosure, as shown in FIG. 2, the first band-pass filter circuit 10 includes: a first capacitor C1, a second capacitor C2, a third capacitor C3, a fourth capacitor C4, a first inductor L1, a second inductor L2, and a ground terminal GND. A first electrode of the first capacitor C1 is connected with the first port A, and a second electrode of the first capacitor C1 is connected with a first electrode of the second capacitor C2; a second electrode of the second capacitor C2 is connected with the second band-pass filter circuit 20; a first electrode of the third capacitor C3 is connected with the second electrode of the second capacitor C2, and a second electrode of the third capacitor C3 is connected with a first electrode of the fourth capacitor C4; a second electrode of the fourth capacitor C4 is connected with the ground terminal GND; a first electrode of the first inductor L1 is connected with the first electrode of the first capacitor C1, and a second electrode of the first inductor L1 is connected with the second electrode of the first capacitor C1; a first electrode of the second inductor L2 is connected with the first electrode of the fourth capacitor C4, and a second electrode of the second inductor L2 is connected with the second electrode of the fourth capacitor C4.

In embodiments of the present disclosure, the first inductor L1 and the second inductor L2 are multilayer inductors. For example, the first inductor L1 and the second inductor L2 may be a 3-layer inductor.

For example, the inductors in the first band-pass filter circuit 10 may be realized by a 3D glass-based, high-resistance silicon-based, or ceramic-based wire-wound inductor, or by a 2D wire-wound inductor formed of a resin material, and is not limited herein.

For example, the capacitors in the first band-pass filter circuit 10 may be realized by an ultra-thin 2-layer capacitor structure, or by a multi-layer thickened capacitor structure, without limitation herein.

The dimensions of the inductors and capacitors in the first band-pass filter circuit 10 may be designed according to the device dimensions, resulting in a device dimension that may be reduced to the millimeter level, which is much smaller than the common centimeter level devices.

Herein, the first band-pass filter circuit 10 mainly has an out-of-band suppression effect on the low-frequency and the high-frequency, and by using a relatively small number of components, it is possible to form one transmission zero at 2.4 GHz outside the low-frequency band and one transmission zero at 6.1 GHz outside the high-frequency band. In addition, the frequency at the position of the transmission zero can also be adjusted by finely tuning the inductance and capacitance, which has a good out-of-band suppression effect on the low-frequency and the high-frequency.

Figure 3:
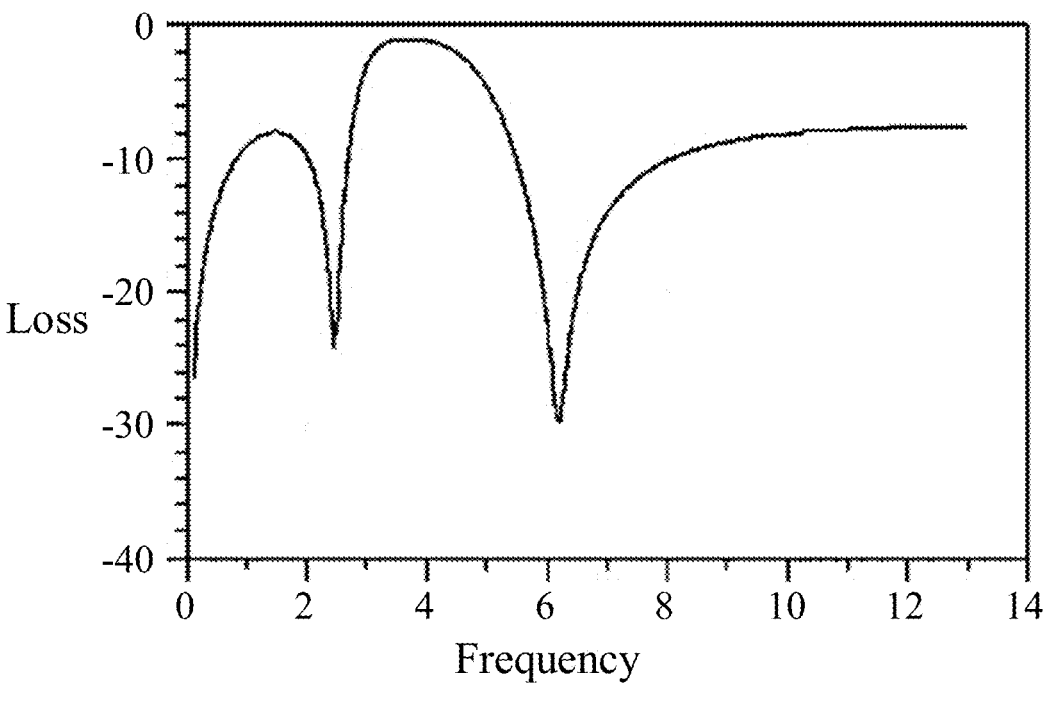
FIG. 3 shows some curve diagrams according to embodiments of the present disclosure.

For example, as shown in FIG. 3, where the abscissa is the frequency and the ordinate is the loss, it can be seen from FIG. 3 that the first band-pass filter circuit 10 not only generates passband characteristics at the 3 GHz, but also generates transmission zeros at the 2.4 GHz and the 6.1 GHZ, which are capable of well hindering signals near the frequency point of the 2.4 GHz (e.g., ±100M) from passing through, as well as, well hindering signals near the frequency point of the 6.1 GHz (e.g., ±200 M) from passing through, suppressing the out-of-band low-frequency and the out-of-band high-frequency. In addition, it can also be seen from FIG. 3 that the first band-pass filter circuit 10 may generate additional transmission zeros in the out-of-band low-frequency and out-of-band high-frequency ranges, and the transmission zeros may effectively suppress transmission losses in the low-frequency portion and the high-frequency portion outside the passband, and improve the suppression.

Figure 4:
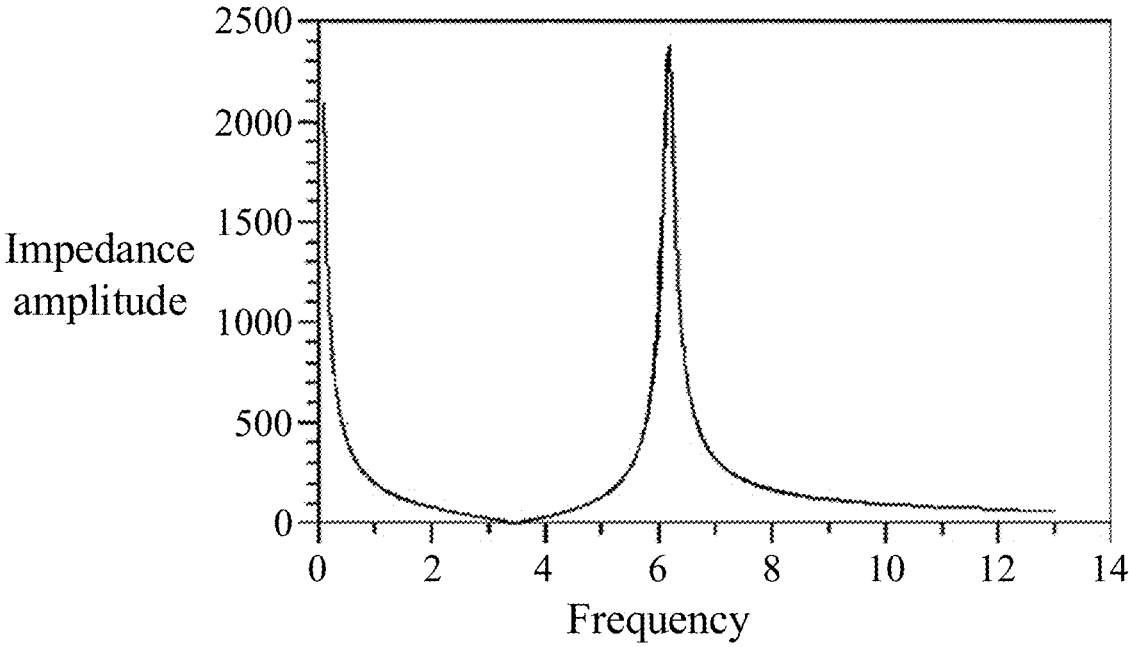
FIG. 4 shows some other curved diagrams according to embodiments of the present disclosure.

For example, a branch circuit consisting of the first capacitor C1, the first inductor L1, and the second capacitor C2 mainly generates a transmission zero at 6.1 GHZ, and signals in the vicinity of 6.1 GHZ (e.g., ±200 M) are attenuated due to the suppression of the transmission zero. The impedance curve is shown in FIG. 4, where the abscissa is the frequency and the ordinate is the magnitude of the impedance.

Figure 5:
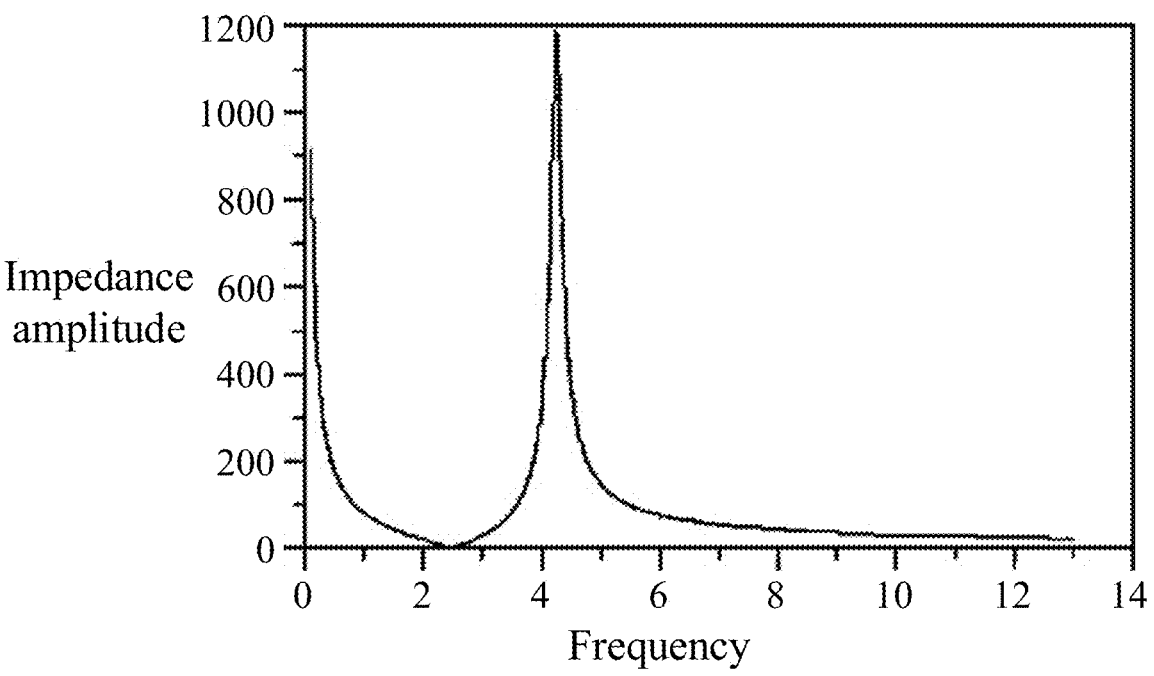
FIG. 5 shows yet some other curved diagrams according to embodiments of the present disclosure.

For example, a branch circuit consisting of the third capacitor C3, the fourth capacitor C4, and the second inductor L2 mainly generates a transmission zero at 2.4 GHZ, and due to the small impedance of this transmission zero, signals in the vicinity of 2.4 GHz (e.g., ±100 M) flow through the parallel branch circuit to the ground terminal GND, which creates a transmission zero on the branch composed of the third capacitor C3, the fourth capacitor C4, and the second inductor L2. The impedance curve is shown in FIG. 5, where the abscissa is the frequency and the ordinate is the impedance magnitude.

In embodiments of the present disclosure, as shown in FIG. 2, the second band-pass filter circuit 20 includes: a fifth capacitor C5, a sixth capacitor C6, a third inductor L3, and a ground terminal GND. A first electrode of the fifth capacitor C5 is connected with the first band-pass filter circuit 10, and a second electrode of the fifth capacitor C5 is connected with the third band-pass filter circuit 30; a first electrode of the sixth capacitor C6 is connected with the second electrode of the fifth capacitor C5, and a second electrode of the sixth capacitor C6 is connected with a first electrode of the third inductor L3; and a second electrode of the third inductor L3 is connected with the ground terminal GND.

Herein, the first electrode of the fifth capacitor C5 in the second band-pass filter circuit 20 is connected with the second electrode of the second capacitor C2 in the first band-pass filter circuit 10.

In embodiments of the present disclosure, the third inductor L3 is a multilayer inductor. For example, the third inductor L3 may be a 3-layer inductor.

For example, the inductor in the second band-pass filter circuit 20 may be realized by a 3D glass-based, high-resistance silicon-based, or ceramic-based wire-wound inductor, or by a 2D wire-wound inductor formed of a resin material, and is not limited herein.

For example, the capacitor in the second band-pass filter circuit 20 may be realized by an ultra-thin 2-layer capacitor structure, or may be realized by a multi-layer thickened capacitor structure, without limitation herein.

The dimensions of the inductor and capacitors in the second band-pass filter circuit 20 may be designed according to the device dimensions, resulting in a device dimension that may be reduced to the millimeter level, which is much smaller than the common centimeter level devices.

The second band-pass filter circuit 20 mainly has an out-of-band suppression effect on the high frequency. By using relatively few components, the second band-pass filter circuit 20 can have a suppression effect on the low frequency of 0 GHz to 1 GHZ, and also has a suppression effect on the high frequency of 10 GHz to 12 GHZ, and the frequency at the position of the transmission zero can also be adjusted by finely tuning the inductance-capacitance, so that the second band-pass filter circuit 20 has a good out-of-band suppression effect on high-frequency. The second band-pass filter circuit 20 can also play the role of impedance matching for connecting the first band-pass filter circuit 10 to the third band-pass filter circuit 30.

Figure 6:
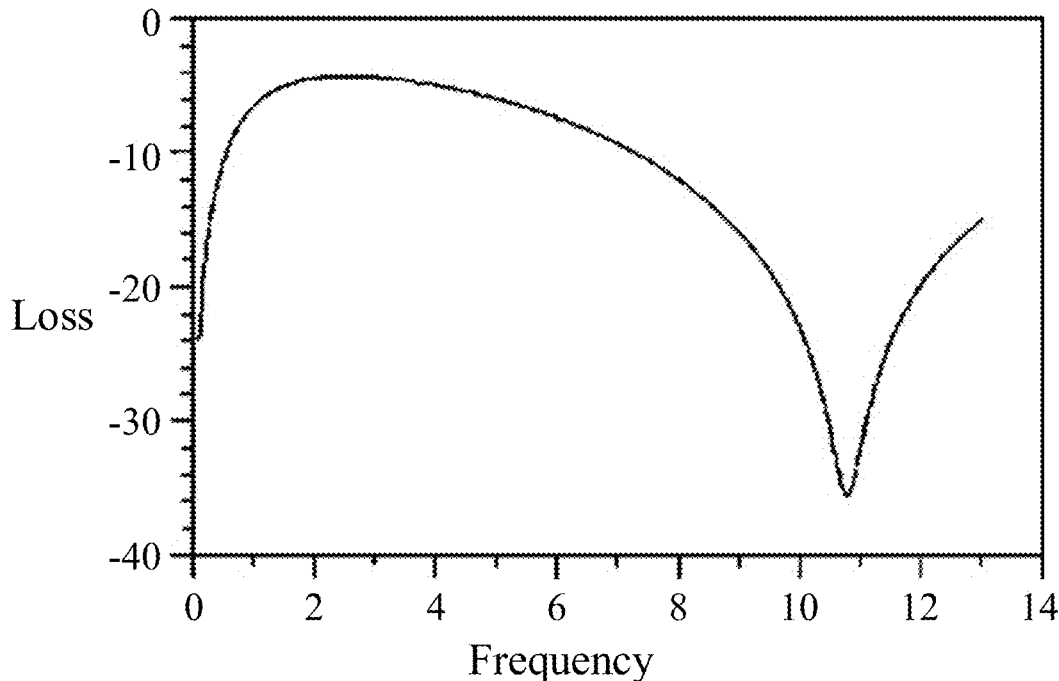
FIG. 6 shows yet some other curved diagrams according to embodiments of the present disclosure.

For example, as shown in FIG. 6, where the abscissa is the frequency and the ordinate is the loss, it can be seen from FIG. 6 that the second band-pass filter circuit 20 mainly generates one transmission zero at the out-of-band high frequency, and is able to connect the first band-pass filter circuit 10 to the third band-pass filter circuit 30 and perform impedance matching, which serves as a transition to each other. The second band-pass filter circuit 20 can generate one transmission zero in the out-of-band high frequency range of 10 GHz to 12 GHz, and this transmission zero can effectively suppress the transmission loss in high frequency portion outside the passband and improve the suppression. The suppression can also be generated for the high frequency portion of less than 6 GHZ, and a specific impedance characteristic can be formed, to achieve impedance matching between the front and back stages.

In embodiments of the present disclosure, as shown in FIG. 2, the third band-pass filter circuit 30 includes: a seventh capacitor C7, an eighth capacitor C8, a ninth capacitor C9, a fourth inductor L4, a fifth inductor L5, and a ground terminal GND. A first electrode of the seventh capacitor C7 is connected with the second band-pass filter circuit 20, and a second electrode of the seventh capacitor C7 is connected with a first electrode of the eighth capacitor C8; and a second electrode of the eighth capacitor C8 is connected with the second port B; a first electrode of the ninth capacitor C9 is connected with the first electrode of the seventh capacitor C7, and a second electrode of the ninth capacitor C9 is connected with a first electrode of the fourth inductor L4; a second electrode of the fourth inductor L4 is connected with the ground terminal GND; a first electrode of the fifth inductor L5 is connected with the first electrode of the seventh capacitor C7, and a second electrode of the fifth inductor L5 is connected with the second electrode of the seventh capacitor C7.

The first electrode of the seventh capacitor C7 in the third band-pass filter circuit 30 is connected with the second electrode of the fifth capacitor C5 in the second band-pass filter circuit 20.

In embodiments of the present disclosure, the fourth inductor L4 and the fifth inductor L5 are single-turn inductors.

For example, the inductor in the third band-pass filter circuit 30 may be realized by a 3D glass-based, high-resistance silicon-based, or ceramic-based wire-wound inductor, or by a 2D wire-wound inductor formed of a resin material, and is not limited herein.

For example, the capacitor in the third band-pass filter circuit 30 may be realized by an ultra-thin 2-layer capacitor structure, or may be realized by a multi-layer thickened capacitor structure, without limitation herein.

The dimensions of the inductors and capacitors in the third band-pass filter circuit 30 may be designed according to the device dimensions, resulting in a device dimension that may be reduced to the millimeter level, which is much smaller than the common centimeter level devices.

Herein, the third band-pass filter circuit 30 mainly has an out-of-band suppression effect on the low-frequency. By using relatively few components, the third band-pass filter circuit 30 forms a transmission zero at 1.8 GHz to 1.9 GHz outside of the low-frequency band, and can form one transmission zero at 7.4 GHz to 7.5 GHz outside of the high-frequency band, and the frequency at the position of the transmission zero can be adjusted by finely tuning the inductance and capacitance, resulting in well out-of-band on the low-frequency.

Figure 7:
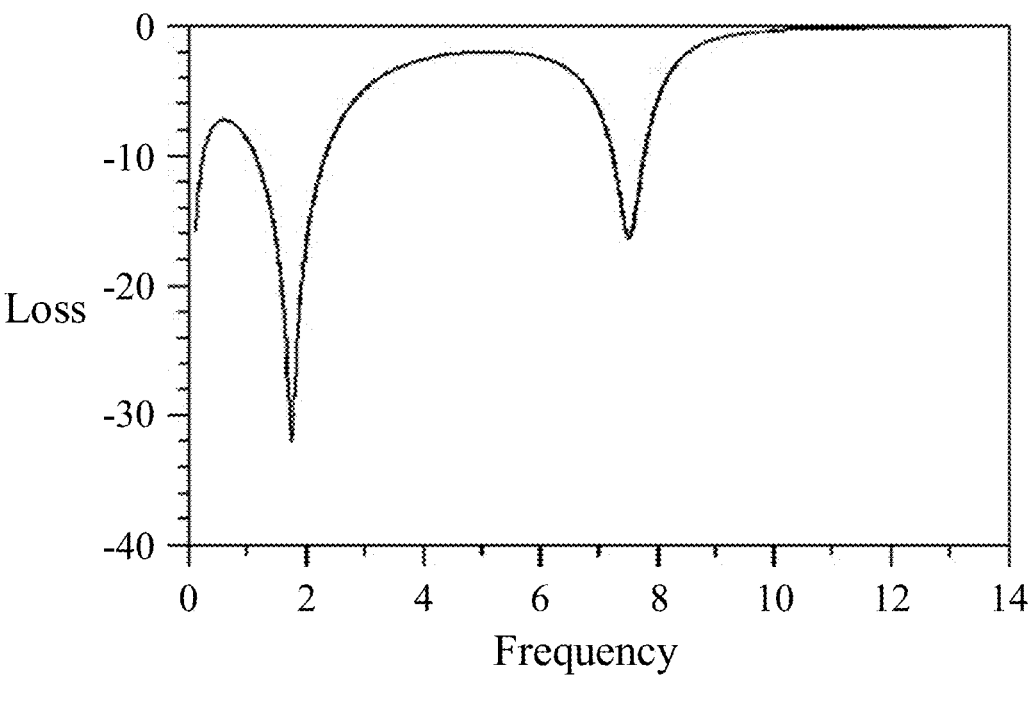
FIG. 7 shows yet some other curved diagrams according to embodiments of the present disclosure.

For example, as shown in FIG. 7, where the abscissa is the frequency and the ordinate is the loss, it can be seen from FIG. 7 that the third band-pass filter circuit 30 mainly produces the out-of-band suppression effect for the low-frequency, and can generates transmission zeros at 1.8 GHz to 1.9 GHz and 7.4 GHz to 7.5 GHZ, which can very well impede the passage of signals in the vicinity of these two frequency points, and play a role in the suppression of the out-of-band low frequency. The third band-pass filter circuit has a relatively large suppression effect on the out-of-band low frequency, but a relatively small suppression effect on the out-of-band high frequency. The third band-pass filter circuit 30 may generate additional transmission zeros in range of the out-of-band high-frequency, and the transmission zeros may effectively suppress the transmission loss of the high-frequency portion outside the passband and improve the suppression.

Figure 8:
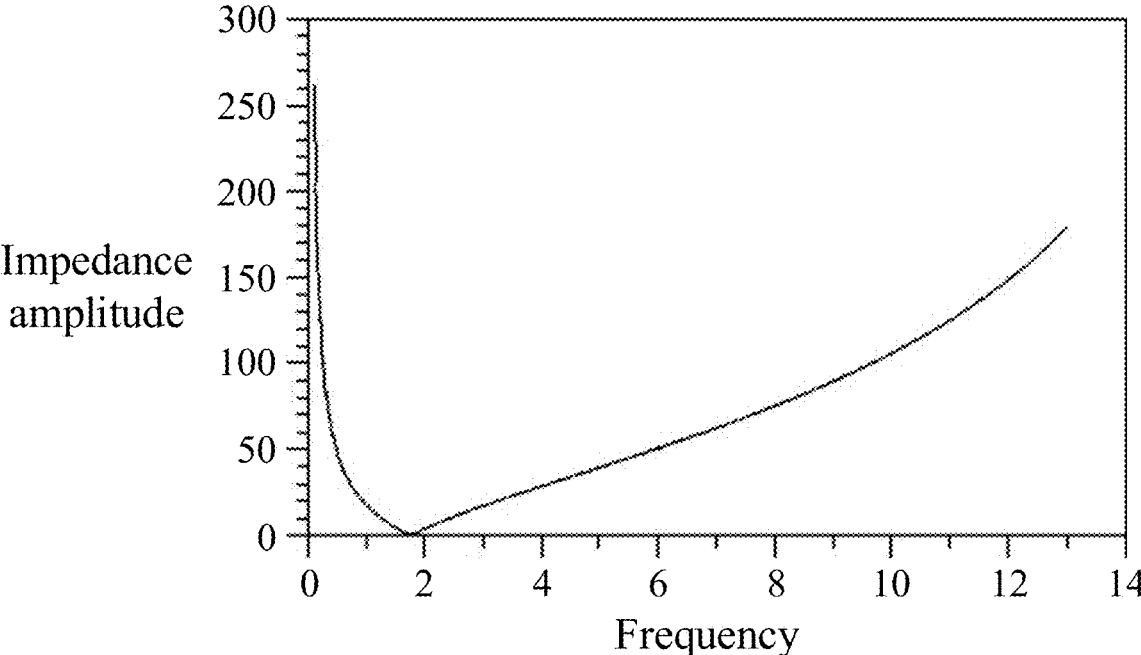
FIG. 8 shows yet some other curved diagrams according to embodiments of the present disclosure.

For example, a branch circuit consisting of the seventh capacitor C7, the eighth capacitor C8, and the fifth inductor L5 mainly generates a transmission zero at 7.4 GHz with an impedance curve as shown in FIG. 8, where the abscissa is the frequency and the ordinate is the impedance amplitude.

Figure 9:
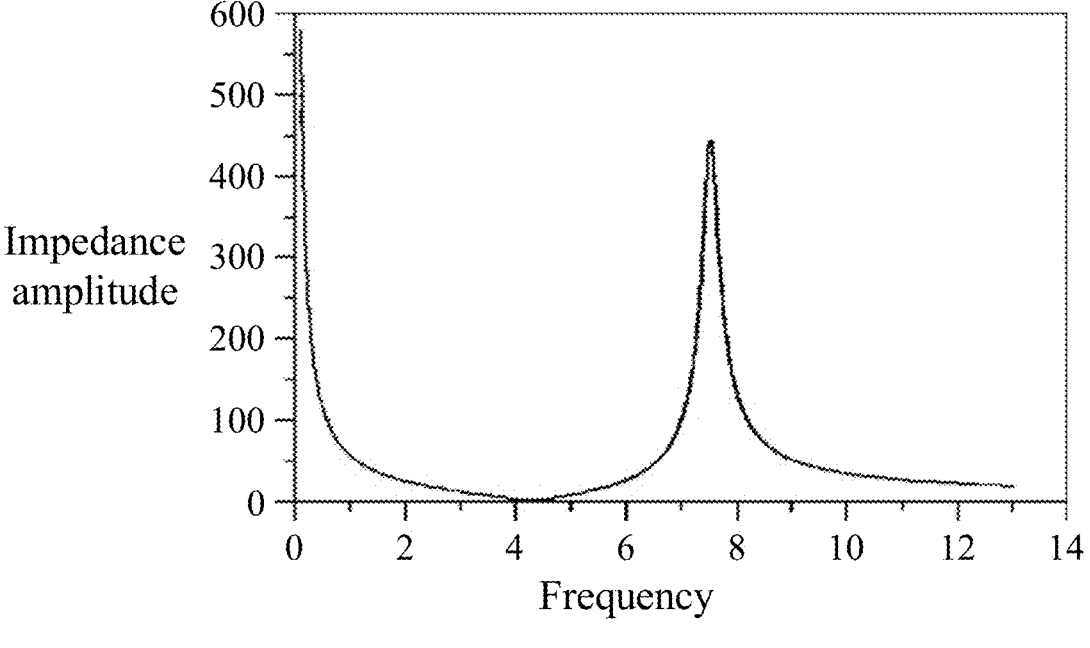
FIG. 9 shows yet some other curved diagrams according to embodiments of the present disclosure.

For example, a branch circuit consisting of the ninth capacitor C9 and the fourth inductor L4 mainly generates a transmission zero at 1.8 GHz with an impedance curve shown in FIG. 9, where the abscissa is the frequency and the ordinate is the impedance amplitude.

Figure 10:
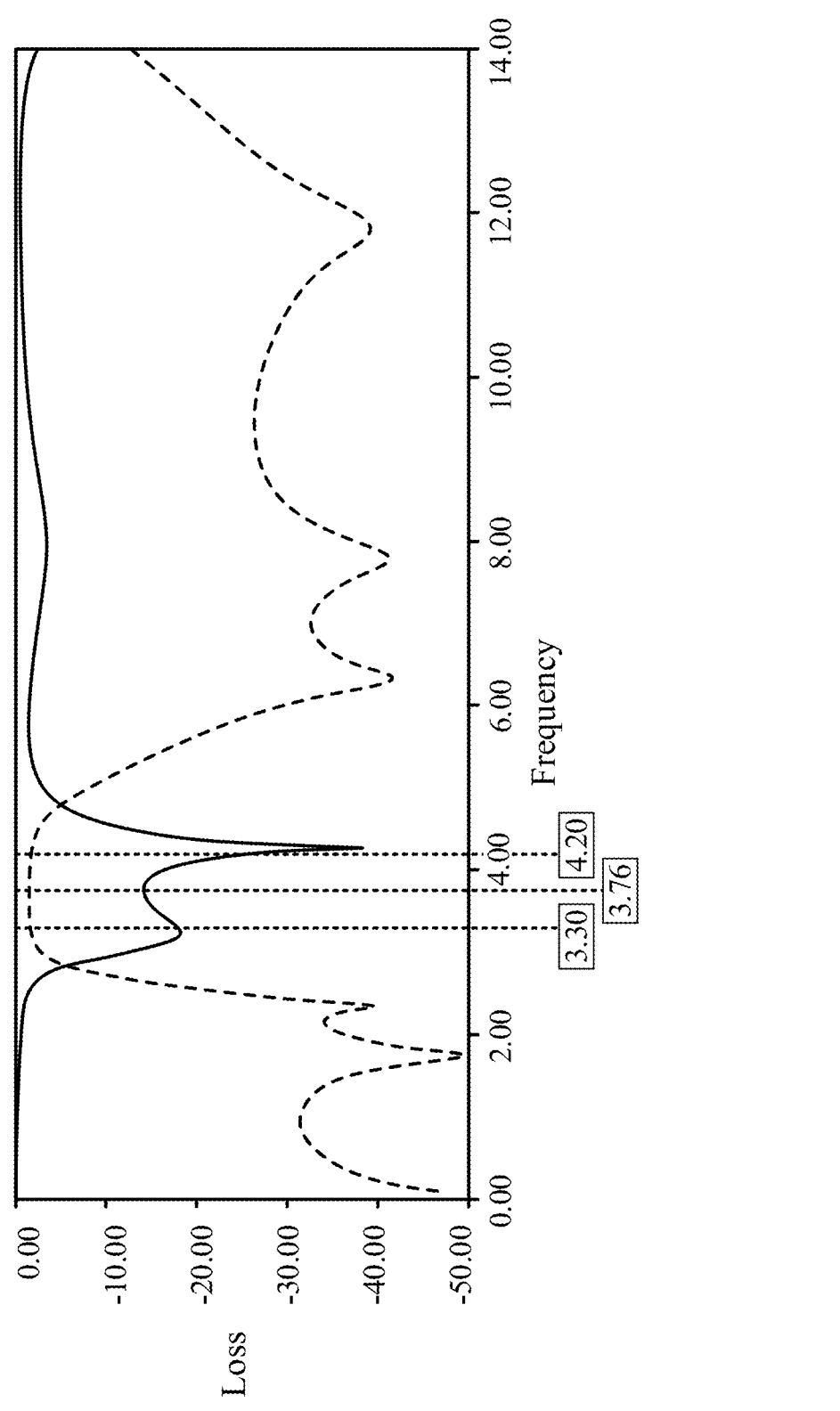
FIG. 10 shows some simulation diagrams of a filter according to embodiments of the present disclosure.

In summary, the filter formed by the combination of the first band-pass filter circuit 10, the second band-pass filter circuit 20, and the third band-pass filter circuit 30 can be seen in a simulation of the filter in FIG. 10. The solid line in FIG. 10 represents the return loss, the dashed line in FIG. 10 represents the S-parameter loss, the abscissa is the frequency and the ordinate is the loss. The filter in the present disclosure has good out-of-band suppression at both the low frequency and the high frequency, and also has better standing waves in the passband, which facilitates tolerance consistency in manufacturing.

For example, the capacitance values of the capacitors in the filter according to embodiments of the present disclosure may be set to be different, so that different capacitors are designed with their capacitance values according to their functions. Of course, the capacitance values of these capacitors may also be set to be partially the same, so that the design difficulty may be reduced.

For example, the inductance values of the inductors in the filter according to embodiments of the present disclosure may be set to be different, to enable different inductors to design their inductance values according to their functions. Of course, the inductance values of these inductors can also be set to be partially the same, which can reduce the design difficulty.

For example, the capacitance values of the capacitors in the filter according to embodiments of the present disclosure range from 0.5 pF to 10 pF.

For example, the inductance values of the inductors in the filter according to embodiments of the present disclosure range from 0.5 nH to 10 nH.

For example, the filter of the present disclosure is formed on a glass substrate.

In embodiments of the present disclosure, the first electrode or the second electrode of the seventh capacitor C7 is multiplexed as a connection wire of the fifth inductor L5.

In embodiments of the present disclosure, the first electrode or the second electrode of the ninth capacitor C9 is multiplexed as a connection wire of the fourth inductor L4.

Figure 11:
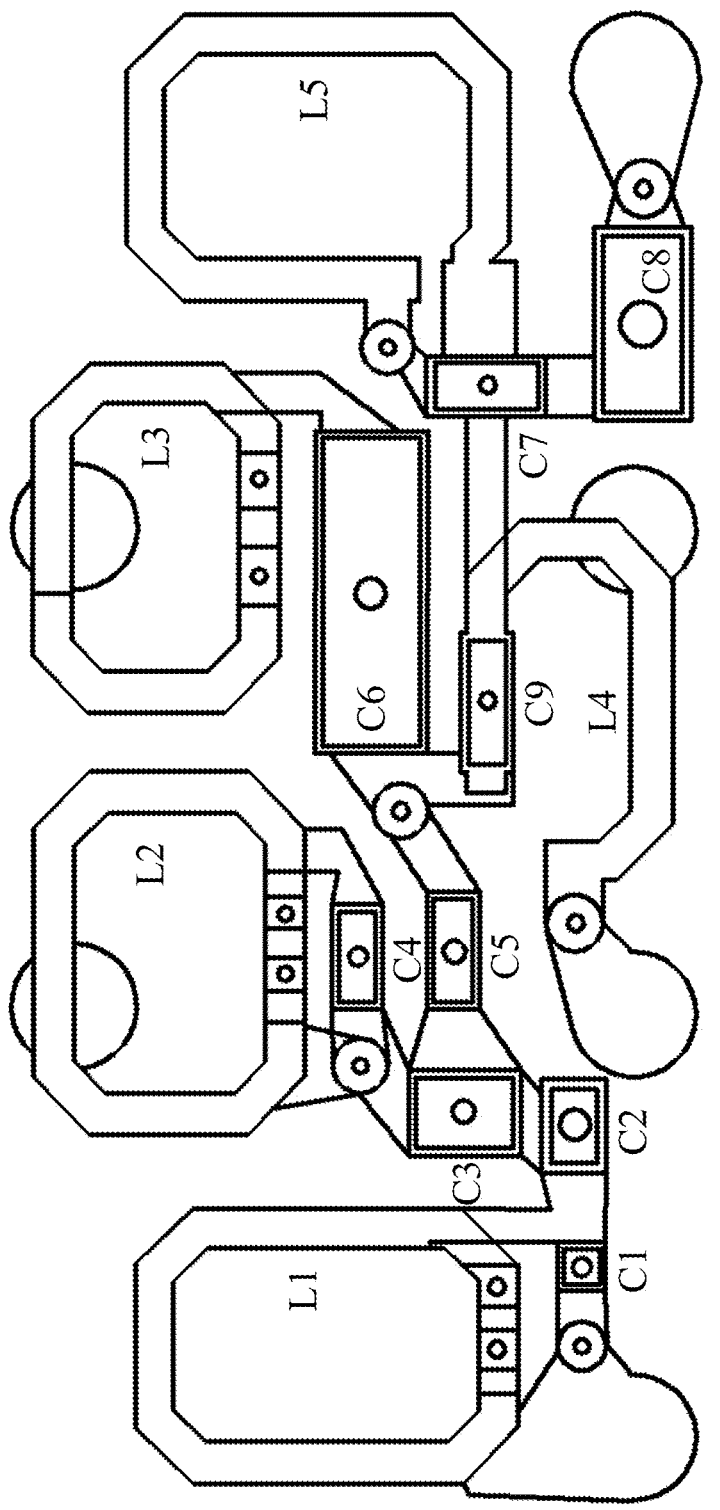
FIG. 11 shows yet another schematic diagram of some structures of a filter according to embodiments of the present disclosure.

For example, as shown in FIG. 11, the third band-pass filter circuit employs a combination of a single-turn inductor and a capacitor, that is, one of the electrodes of the capacitor is multiplexed as a connection wire of the inductor. Herein, the wire of the single-turn inductor is fabricated on a surface of the glass base, the single-turn inductor is able to achieve a larger Q value, and the combination of the single-turn inductor and the capacitor is able to form one transmission zero, which can satisfy the specifications. Due to that the inductor is closer to the glass and farther away from the carrier board, it is not easily affected by the different layouts and wiring of the carrier board, improving the compatibility of the device and extending its application scenarios.

For example, as shown in FIG. 11, the present disclosure reasonably designs the positions of the capacitors and inductors in the first band-pass filter circuit, the second band-pass filter circuit, and the third band-pass filter circuit, and uniformly lays out the capacitors and inductors on the device, which is conducive to the uniformity of layout placement and heat distribution, and the most reasonably utilization of the layout space.

In embodiments of the present disclosure, the connecting line between a capacitor and an inductor in the filter is a stubby type connecting line.

For instance, the connecting lines between the first inductor L1, the second inductor L2, the third inductor L3, the fourth inductor L4, and the fifth inductor L5, and the first capacitor C1, the second capacitor C2, the third capacitor C3, the fourth capacitor C4, the fifth capacitor C5, the sixth capacitor C6, the seventh capacitor C7, the eighth capacitor C8, and the ninth capacitor C9 are stubby type connecting lines, that is, the connecting line between the above mentioned capacitors and inductors is as thick and short as possible. The resistance of the connecting line is mainly related to the width and thickness of the connecting line, of which the thickness is determined by the process parameters and cannot be adjusted in the layout. However, by using a thicker connecting line, the signal attenuation is minimized and the loss is optimized.

In addition, all the above capacitors are used as large as possible, because the capacitor is composed of very thin double-sided dielectric, the dielectric between the electrodes of the capacitor is very thin, and it is easy to produce process deviation, the use of larger size capacitors can effectively reduce the impact of process deviation, to improve product consistency. Moreover, the current density of the capacitor can be reduced, improving the carrying power.

Figure 12:
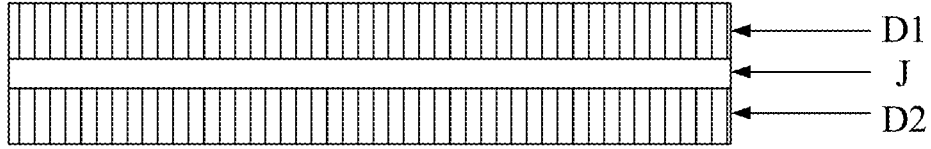
FIG. 12 shows a schematic diagram of some structures of a capacitor according to embodiments of the present disclosure.

For example, FIG. 12 shows a sectional structural view of the above-described capacitor, and it can be seen from FIG. 12 that the capacitor includes upper and lower electrodes (D1 and D2 in FIG. 12) and a dielectric J between the electrodes.

Figure 13:
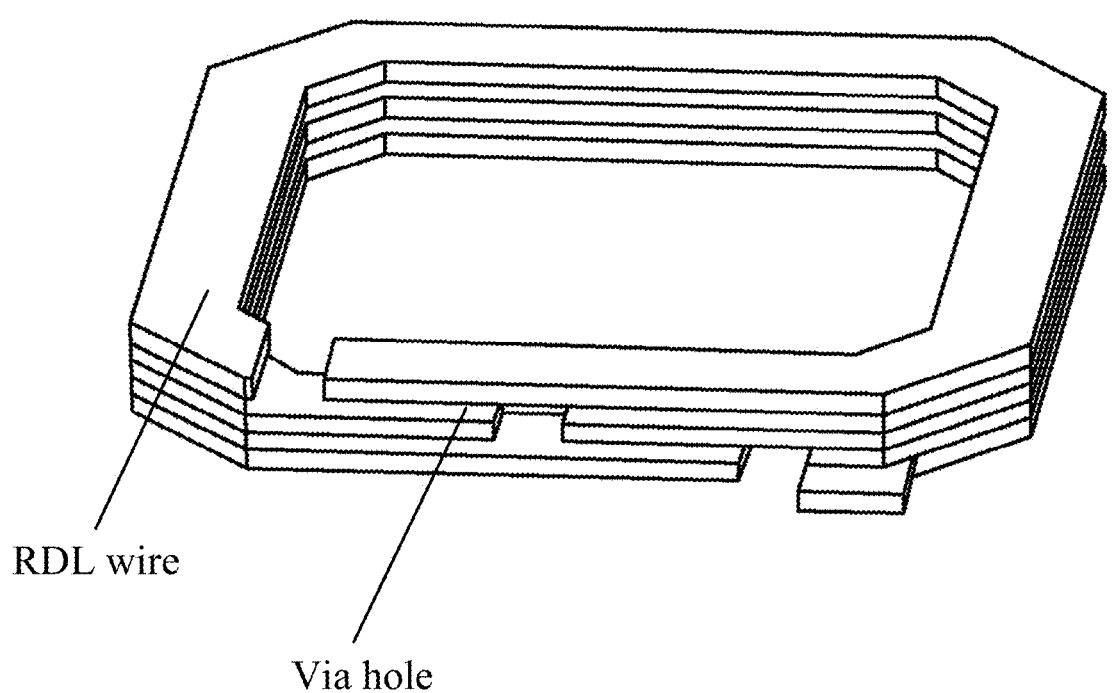
FIG. 13 shows a schematic diagram of some structures of an inductor according to embodiments of the present disclosure.

For example, FIG. 13 shows a schematic structural diagram of the above-described inductor, the inductor is fabricated on the surface of a glass substrate, and it can be seen from FIG. 13 that the inductor is composed of metal RDL wires, the polyimide (PI) material is used as a support between the metal RDL wires, and the metallized via holes are used to connect between each layer of metal RDL wires.

For example, the filter is composed of a plurality of inductors and capacitors, the capacitors are mainly fabricated on the upper surface of the glass, the capacitors and the inductors are connected using metal RDL wires, and the filter further includes a plurality of bonding points (PADs) for inputting and outputting signals from the components, and also for grounding.

The filter in embodiments of the present disclosure is a high-frequency filter for eliminating interference clutter signals, and filtering the input signals or output signals to obtain pure high-frequency signals.

Based on the same inventive concept, embodiments of the present disclosure further provide an integrated passive device including the above-described filter according to the present disclosure embodiments. The principle of the integrated passive device solving the problem is similar to that of the aforementioned filter, so the implementation of the integrated passive device can be seen in the implementation of the aforementioned filter, and repetitions will be omitted.

Based on the same inventive concept, embodiments of the present disclosure further provide an electronic device including the aforementioned integrated passive device according to embodiments of the present disclosure. The principle of the electronic device solving the problem is similar to that of the aforementioned integrated passive device, so the implementation of the electronic device can be referred to the implementation of the aforementioned integrated passive device, and repetitions will be omitted.

For example, the electronic device may be an RF device.

Although embodiments of the present disclosure have been described, those skilled in the art will be able to make additional changes and modifications to these embodiments once the basic inventive concepts are apparent. Therefore, it is intended that the appended claims be construed to include embodiments and all changes and modifications that fall within the scope of the present disclosure.

Obviously, those skilled in the art can make various changes and modifications to embodiments of the present disclosure without departing from the spirit and scope of embodiments of the present disclosure. In this way, if these modifications and variations of embodiments of the present disclosure fall within the scope of the claims of the present disclosure and equivalent technologies, the present disclosure is also intended to include these modifications and variations.

What is claimed is:

1. A filter, comprising: a first port, a second port, a first band-pass filter circuit, a second band-pass filter circuit, and a third band-pass filter circuit; wherein the first band-pass filter circuit is connected with the first port and configured to input a first signal with a frequency between a first frequency and a second frequency in an initial signal input from the first port to the second band-pass filter circuit;

the second band-pass filter circuit is connected with the first band-pass filter circuit and configured to: receive the first signal, and input a second signal with a frequency between a third frequency and a fourth frequency in the first signal to the third band-pass filter circuit; and the third band-pass filter circuit is connected with the second band-pass filter circuit and configured to: receive the second signal, and input a third signal with a frequency between a fifth frequency and a sixth frequency in the second signal to the second port;

wherein the first frequency and the fifth frequency are each greater than the third frequency, the sixth frequency and the fourth frequency are each greater than the second frequency, and the second frequency is greater than the first frequency.

2. The filter according to claim 1, wherein the first frequency is same as the fifth frequency, and the sixth frequency is same as the fourth frequency.

3. The filter according to claim 1, wherein the first band-pass filter circuit comprises: a first capacitor, a second capacitor, a third capacitor, a fourth capacitor, a first inductor, a second inductor, and a ground terminal;

a first electrode of the first capacitor is connected with the first port, and a second electrode of the first capacitor is connected with a first electrode of the second capacitor;

a second electrode of the second capacitor is connected with the second band-pass filter circuit;

a first electrode of the third capacitor is connected with the second electrode of the second capacitor, and a second electrode of the third capacitor is connected with a first electrode of the fourth capacitor;

a second electrode of the fourth capacitor is connected with the ground terminal;

a first electrode of the first inductor is connected with the first electrode of the first capacitor, and a second electrode of the first inductor is connected with the second electrode of the first capacitor; and a first electrode of the second inductor is connected with the first electrode of the fourth capacitor and a second electrode of the second inductor is connected with the second electrode of the fourth capacitor.

4. The filter according to claim 3, wherein the first inductor and the second inductor are multilayer inductors.

5. The filter according to claim 4, wherein, the second band-pass filter circuit comprises: a fifth capacitor, a sixth capacitor, a third inductor, and a ground terminal;

a first electrode of the fifth capacitor is connected with the first band-pass filter circuit, and a second electrode of the fifth capacitor is connected with the third band-pass filter circuit;

a first electrode of the sixth capacitor is connected with the second electrode of the fifth capacitor, and a second electrode of the sixth capacitor is connected with a first electrode of the third inductor; and a second electrode of the third inductor is connected with the ground terminal.

6. The filter according to claim 5, wherein the third inductor is a multilayer inductor.

7. The filter according to claim 1, wherein the third band-pass filter circuit comprises: a seventh capacitor, an eighth capacitor, a ninth capacitor, a fourth inductor, a fifth inductor, and a ground terminal;

a first electrode of the seventh capacitor is connected with the second band-pass filter circuit, and a second electrode of the seventh capacitor is connected with a first electrode of the eighth capacitor;

a second electrode of the eighth capacitor is connected with the second port;

a first electrode of the ninth capacitor is connected with the first electrode of the seventh capacitor, and a second electrode of the ninth capacitor is connected with a first electrode of the fourth inductor;

a second electrode of the fourth inductor is connected with the ground terminal; and a first electrode of the fifth inductor connected with the first electrode of the seventh capacitor, and a second electrode of the fifth inductor is connected with the second electrode of the seventh capacitor.

8. The filter according to claim 7, wherein the fourth inductor and the fifth inductor are single-turn inductors.

9. The filter according to claim 7, wherein the first electrode or the second electrode of the seventh capacitor is multiplexed as a connection wire of the fifth inductor; and the first electrode or the second electrode of the ninth capacitor is multiplexed as a connection wire of the fourth inductor.

10. The filter according to claim 1, wherein a connecting line between a capacitor and an inductor in the filter is a stubby type connecting line.

11. The filter according to claim 1, wherein capacitors in the filter have different capacitance values.

12. The filter according to claim 11, wherein the capacitance values of the capacitors in the filter range from 0.5 pF to 10 pF.

13. The filter according to claim 1, wherein inductors in the filter have different inductance values.

14. The filter according to claim 13, wherein the inductance values of the inductors in the filter range from 0.5 nH to 10 nH.

15. The filter according to claim 1, wherein the filter is formed on a glass substrate.

16. The filter according to claim 1, wherein the filter is a high frequency filter.

17. An integrated passive device, comprising the filter according to claim 1.

18. An electronic device, comprising an integrated passive device according to claim 17.

\* \* \* \* \*